(12) United States Patent
Tate et al.

(10) Patent No.: US 6,897,124 B2
(45) Date of Patent: May 24, 2005

(54) METHOD OF MANUFACTURING A BONDED WAFERS USING A BERNOULLI CHUCK

(75) Inventors: Naoto Tate, Annaka (JP); Hiroji Aga, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 10/478,664

(22) PCT Filed: May 27, 2002

(86) PCT No.: PCT/JP02/05116
§ 371 (c)(1),
(2), (4) Date: Nov. 24, 2003

(87) PCT Pub. No.: WO02/097893
PCT Pub. Date: Dec. 5, 2002

(65) Prior Publication Data
US 2004/0152283 A1 Aug. 5, 2004

(30) Foreign Application Priority Data
May 28, 2001 (JP) .................................. 2001-158927

(51) Int. Cl.⁷ .............................................. H01L 21/30
(52) U.S. Cl. ...................... 438/458; 438/464; 438/977; 257/E21.568; 414/935; 414/937; 414/941
(58) Field of Search ................................ 438/455–459, 438/977, 471–477, 143, 464; 257/E21.568; 414/935–941

(56) References Cited

U.S. PATENT DOCUMENTS 5,374,564 A  12/1994  Bruel 6,527,031 B1 * 3/2003 Yanagita et al. ............. 156/584

FOREIGN PATENT DOCUMENTS

| EP | 0 961 312 A2 | 12/1999 |
|---|---|---|
| EP | 0 999 575 A2 | 5/2000 |
| JP | 5-21128 | 12/1994 |
| JP | 2000-36583 | 12/1999 |
| JP | 2000-077287 | 3/2000 |
| JP | 2000-0150456 | 5/2000 |
| JP | 2001-094081 | 4/2001 |

* cited by examiner

Primary Examiner—George Fourson
Assistant Examiner—Thanh V. Pham
(74) Attorney, Agent, or Firm—Ronald R. Snider; Snider & Associates

(57) ABSTRACT

A bonded wafer 27 and a residual wafer 28 are placed in a state of being superimposed on each other on a susceptor 20 disposed in a heat treatment 10. A Bernoulli chuck 1 is moved to a wafer holding position 60 on a susceptor 20 by driving an arm 56, sucks the bonded wafer 27 positioned on the upper side and then moves to a bonded wafer recovery table 50' to recover the bonded wafer there. Then, similarly, the Bernoulli chuck 1 suction holds the residual wafer 28 at the wafer holding position 60 and then moves to a residual wafer recovery table 50" to recover the residual wafer there. With such a construction adopted, in a method for manufacturing a bonded wafer according to a so-called smart-cut method, not only is the separated bonded wafer recovered suppressing occurrence of a defect, deficiency and contamination, but there is also provided a method for manufacturing a bonded wafer capable of automation suitable for mass production.

12 Claims, 10 Drawing Sheets

STEP 1 ⇨
STEP 2 ⬛➡

(a)

(b)

(c)

(d)

(e)

METHOD OF MANUFACTURING A BONDED WAFERS USING A BERNOULLI CHUCK

TECHNICAL FIELD

This invention relates to a method for manufacturing a bonded wafer.

BACKGROUND ART

Among processes for forming an SOI (Silicon on Insulator) wafer, there has been, for example, a process in which silicon wafers are bonded to each other with an oxide film interposed therebetween, followed by rendering one silicon wafer to be a thin film. In a case where a semiconductor thin film is formed on a base wafer, not limiting to such an SOI wafer, there can be adopted a method in which a semiconductor wafer and a base wafer are bonded to each other. A so-called smart-cut method (a registered trade mark) described in Japanese Laid-Open Patent Publication No. 05-211128 has been available among methods in which after a semiconductor wafer and a base wafer are bonded to each other in this way, the semiconductor wafer is rendered to be a thin film to thereby prepare a bonded wafer.

A manufacture of a bonded SOI wafer according to the so-called smart-cut method goes this way, for example: At first, a bond wafer 31 providing an SOI layer as shown in (a) of FIG. 11 and a base wafer 32 serving as a support are prepared and an oxide film 33 is formed on at least one of the wafers ((b) of FIG. 11). In (b) of FIG. 11, there is shown a case where the oxide film 33 is formed on the bond wafer 31. At least one kind of a hydrogen ion, a rare gas ion and a halogen ion is implanted into the bond wafer 31 on which the oxide film is formed to form an ion implanted layer 41 ((c) of FIG. 11). The surface of the bond wafer 31 near which the ion implanted layer 41 is formed is closely bonded to the base wafer 32 with the oxide film 33 interposed therebetween to form a bonded dual wafer 34 ((d) of FIG. 11) and thereafter a heat treatment is applied thereto to cause the bond wafer 31 to be separated at the ion implanted layer 41 to form an SOI layer 40, thereby forming a bonded SOI wafer 39 and a residual wafer 38 ((e) of FIG. 11).

Note that a heat treatment and wafer recovery in a step of separating the bond wafer 31 has been conventionally performed in the following way: At first, as shown in FIG. 12A, the bonded dual wafers 34 are erected in holding grooves 30a formed on a boat 30 at angles in the range of from 90 degrees to an angle of the order of 80 degrees relative to the boat 30. Then, the boat 30 is, as shown in FIG. 12B, placed in a horizontal heat treating furnace 35 to conduct a heat treatment at a temperature in the range of from 400 to 600° C. on the bonded dual wafers 34 and to form bonded SOI wafers 39 and residual wafers 38 and thereafter, rear surfaces 39a of the bonded wafers 39 are, as shown in FIG. 12C, sucked with a vacuum pincette 36 to recover the bonded SOI wafers 39 from the boat 30.

In a conventional method, when the vacuum pincette 36 was brought into contact with a rear surface 39a of a bonded SOI wafer 39, a case arose where a defect, deficiency and contamination occurred on the rear surface 39a by pushing with the vacuum pincette 36. Furthermore, when a bonded SOI wafer 39 was taken out, opposed surfaces of a bonded SOI wafer 39 and a residual wafer 38 separated by a heat treatment were rubbed against each other, having also led to a case where a defect and deficiency occurred on a separation surface 39b of the bonded SOI wafer 39. Since the boat 30 and the bonded dual wafers 34 were in contact with each other in the holding grooves 30a at end surfaces of the bonded dual wafers 34, defects, deficiency and the like occurred at the end surfaces thereof by a shock when the bonded dual wafers 34 each obtained by bonding both wafers to each other at room temperature are placed on the boat 30, or when the bonded SOI wafers 39 were recovered even after formation of the bonded SOI wafers 39, having led to a case where defects in products were provoked. Conventionally, since the above process was conducted manually, a problem occurred that neither a defect, deficiency, contamination and the like were sufficiently prevented nor a sufficiently high: productivity was assured. Such problems are not specific to a bonded SOI wafer and occur similarly in cases of other bonded wafers each of which were obtained by bonding a semiconductor wafer and a base wafer to each other as far as the above process was adopted.

It is an object of the invention to provide a method for manufacturing a bonded wafer in which not only is suppression realized on occurrence of a defect, deficiency and contamination when separated bonded wafers are taken out in a method for manufacturing a bonded wafer according to a so-called smart-cut method, but also automation suitable for mass production is enabled.

DISCLOSURE OF THE INVENTION

In order to solve the above problems, a method for manufacturing a bonded wafer of the invention includes: a bonded wafer preparation step of ion implanting at least one kind selected from the group consisting of a hydrogen ion, a rare gas ion and a halogen ion onto a main surface of a first wafer to form an ion implanted layer in the interior of the first wafer and bonding the main surface of the first wafer onto which ion implantation is effected to a main surface of a second wafer to heat treat the first wafer and the second wafer after bonding (hereinafter also referred to as a bonded dual wafer), to thereby separate the first wafer at the ion implanted layer in the form of a thin film; and a wafer recovery step of recovering at least one of a bonded wafer and a residual wafer, which is a residue of the first wafer, supported by a wafer supporting tool in a state of being superimposed on each other after the bonded wafer preparation step by suction holding the at least one using a Bernoulli chuck.

In a method for manufacturing a bonded wafer according to a so-called smart-cut method as described above, the first wafer is separated at the ion implanted layer to thereby form the residual wafer, which is a residue of the first wafer, together with the bonded wafer. The bonded wafer thus formed becomes a final product after a step of polishing the separation surface and the like. On the other hand, the residual wafer left behind by separation in the first wafer is in more of cases reused as the first wafer or the second wafer in the invention. Therefore, the residual wafer is hereinafter also referred to as a reused wafer in the specification.

Therefore, according to the smart-cut method, a necessity arises that after the bonded wafer preparation step, the bonded wafer and the residual wafer supported by a wafer supporting tool in a state of being superimposed on each other are separated from each other to send the bonded wafer and the residual wafer to respective subsequent steps. In order to send the bonded wafer or the reused wafer to a subsequent step in a separate state, a necessity arises for recovery of at least one of the bonded wafer and the reused wafer from the wafer supporting tool. It is preferable to suppress a defect, a deficiency, contamination and the like to occur on surfaces of a bonded wafer to be used as a product and a reused wafer to be reused to the lowest possible levels and a necessity arises for preventing or suppressing a defect, a deficiency, contamination and the like when the wafers are recovered.

According to the invention, recovery is performed in a way such that at least one of a bonded wafer and a reused wafer after preparation of the bonded wafer is suction held by a Bernoulli chuck. With the recovery in such a way adopted, it become easy to recover the bonded wafer and the reused wafer from the wafer supporting tool in a state of being separated from each other. With the Bernoulli chuck used, prevention or suppression can be made on a defect, deficiency, contamination and the like to occur on a bonded wafer and a reused wafer. This is because gas is caused to flow out between the Bernoulli chuck and a wafer to thereby suction hold the wafer on the chuck with the help of a negative pressure generated in a clearance therebetween and to enable the Bernoulli chuck to hold the wafer in no contact with the chuck body. Furthermore, since a driving mechanism to move a Bernoulli chuck or a gas outflow mechanism for suction holding a wafer can be automated with ease, quickness and correctness in a wafer recovery step is realized with improvement on a productivity by automation of the wafer recovery step with the Bernoulli chuck.

Since a bonded wafer and a residual wafer are supported by the wafer supporting tool in a state of being superimposed on each other after the bonded wafer preparation step, it is preferable for the Bernoulli chuck to approach a main surface on the other side from the superimposition interface between the bonded wafer and the residual wafer to recover the bonded wafer or the residual wafer in the wafer recovery step. In such an operation, a wafer on the side that a Bernoulli chuck approaches is suction held by a negative pressure caused by outflow of gas of the Bernoulli chuck.

In the invention, it is preferable that a bonded wafer and a residual wafer are superimposed on each other in a direction, from above to below or from below to above, and in this state, supported by a wafer supporting tool. By doing so, it becomes easy to suction hold a wafer with a Bernoulli chuck, thereby enabling improvement on productivity to be expected. In this case, as described above, the bonded wafer and the residual wafer superimposed on each other are sequentially recovered by suction from one positioned on the upper side with the Bernoulli chuck. When the one positioned on the upper side is suction held, the other on the lower side falls down under an influence of gravity, which causes separation of the bonded wafer from the residual wafer with ease. Even in a case where it is impossible to effect sufficient separation in the first wafer at an ion implanted layer by a heat treatment in the bonded wafer preparation step, an effect can also be thought that separation at the ion implanted layer becomes easy to occur under an influence of gravity imposed on a wafer on the lower side. Since the bonded wafer and the residual wafer are separated from each other under a influence of gravity, an influence of an undesirable, external force can be alleviated to the lowest possible level, thereby also enabling occurrence of a defect, deficiency and the like at the superimposition interface between the bonded wafer and the residual wafer to be prevented or suppressed.

In a case where in the wafer recovery step, a bonded wafer and a residual wafer are supported by the wafer supporting tool in a state of being superimposed on each other, bonded dual wafers in the bonded wafer preparation step are supported on the wafer holding tool so that main surfaces of the wafers are almost horizontal, and in this state, arranged in a heat treatment furnace for a heat treatment. With such an arrangement, since the bonded dual wafers have no chance to be held at end surfaces thereof, it is possible to prevent or suppress occurrence of a defect, deficiency, contamination and the like.

In the invention, there are set a wafer holding position at which a bonded wafer and/or a residual wafer on a wafer supporting tool is held and a wafer recovery position at which the bonded wafer and/or the residual wafer held is recovered and a Bernoulli chuck can be moved between them. A bonded wafer and/or a residual wafer is suction held at the wafer holding position and in this state, the Bernoulli chuck moves to the wafer recovery position to cancel holding there and to thereby recover the bonded wafer and/or the residual wafer. To drive a Bernoulli chuck in a step as described above enables driving of the Bernoulli chuck to be simplified. With a driving section driving a Bernoulli chuck and a control section controlling motion of the driving section provided, it is easy to automate the wafer recovery step with a Bernoulli chuck.

It is preferable to install a bonded wafer recovery position for recovering a bonded wafer and a residual wafer recovery position for recovering a residual wafer at respective positions different from each other. With such a construction adopted, since wafers recovered at respective recovery positions can be sent directly to corresponding steps subsequent thereto, simplification of a manufacture line can be expected more and in turn, automation in the wafer recovery step becomes easier.

The wafer recovery step may be conducted in a transport route along which a bonded wafer and a residual wafer are transported continuously or intermittently. In this case, a bonded wafer and/or a residual wafer is moved from a wafer holding position on the transport route to a wafer recovery position located spaced apart from the transport route in a horizontal direction. By conducting the wafer recovery step in the transport route, the wafer recovery step is conducted more smoothly. In a case where wafer holding positions are fixed in the transport route and wafers are transported to the respective wafer holding positions, a driving step of a Bernoulli chuck is simplified, leading to improvement on productivity. It is also preferable to conduct a heat treatment in the bonded wafer preparation step prior to the wafer recovery step in the transport route. With such a construction, there is an advantage that the wafer recovery step can be conducted continuously in the same transport route after completion of the bonded wafer preparation step.

BEST MODE FOR CARRYING OUT THE INVENTION

Description will be given of a case where a bonded SOI wafer is manufactured in the best mode for carrying out the invention with reference to the accompanying drawings.

A method for manufacturing bonded SOI wafer in the best mode for carrying out the invention includes: a bonded SOI wafer preparation step according to a so-called smart-cut method; and a recovery step of recovering the bonded SOI wafer using a Bernoulli chuck. Details of the bonded SOI wafer preparation step according to a so-called smart-cut method are here omitted since the details are described in FIG. 11. A bonded SOI wafer is also referred to simply as a bonded wafer in this embodiment.

Figure 1A:
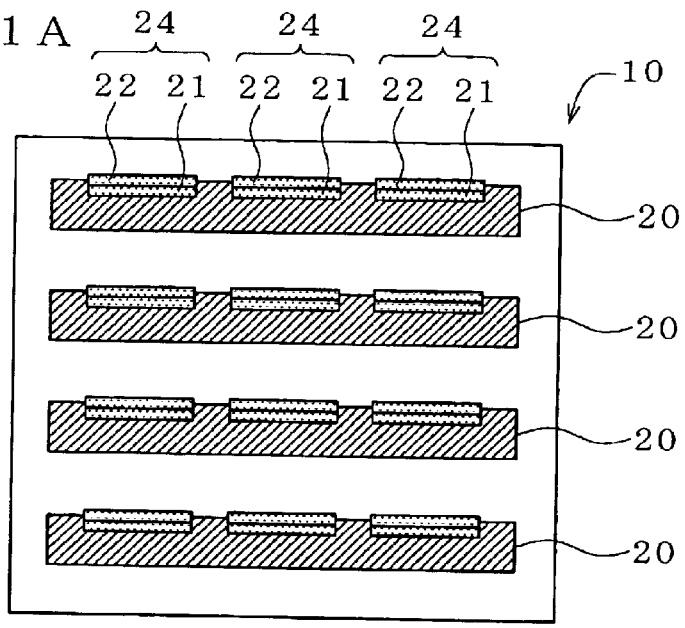
FIG. 1A is a view showing an example heat treatment furnace in which a heat treatment step is conducted.

A heat treatment furnace used in a heat treatment in the bonded wafer preparation step (hereinafter referred to simply as a heat treatment step) is, for example, a heat treatment furnace as shown in FIG. 1A. In the oven type heat treatment furnace 10, arranged in the interior are several levels of susceptors 20 as wafer supporting tools on which bonded dual wafers 24 each composed of a bond wafer 21 and a base wafer 22 bonded to each other are placed. A width of a plateau of each level is set so that a Bernoulli chuck 1 can intrude over the plateau. The interior of the oven type heat treatment furnace 10 is heated to a desired temperature to thereby apply a heat treatment on the bonded dual wafers 24. The heat treatment can be conducted in conditions that the interior is held at 500° C. for 30 min. As a heat treatment furnace used in the heat treatment, a furnace capable of heating at a temperature up to 500° C. at the lowest can be sufficiently used since the heat treatment step is conducted at a temperature in the vicinity of 500° C. Therefore, no necessity arises for the use of a highly expensive furnace such as a diffusion furnace for a semiconductor wafer capable of heating at 1000° C. or higher and the oven type heat treatment furnace 10 described above can be preferably used.

Figure 1B:
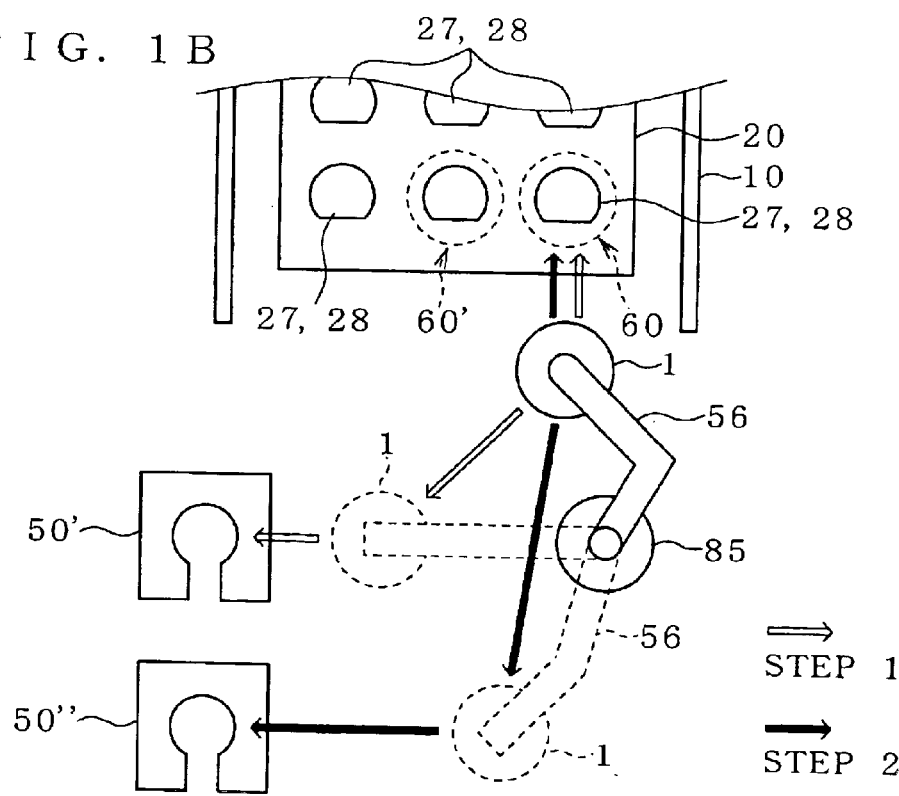
FIG. 1B is a view describing an outline of a wafer recovery step from the heat treatment furnace of FIG. 1A.

FIG. 1B describes a step of recovering bonded wafers 27 or residual wafers 28 from the oven type heat treatment furnace 10. The wafer recovery step is, as shown in FIG. 1B, conducted by inserting the Bernoulli chuck 1 into the oven type heat treatment furnace 10. The bonded wafers 27 and the residual wafers 28 placed on a wafer supporting tool 20 in a state of being superimposed on each other are sequentially sucked and recovered with the Bernoulli chuck 1, firstly from one positioned on the upper side, followed by the other, in each bonded dual wafer.

Figure 2A:
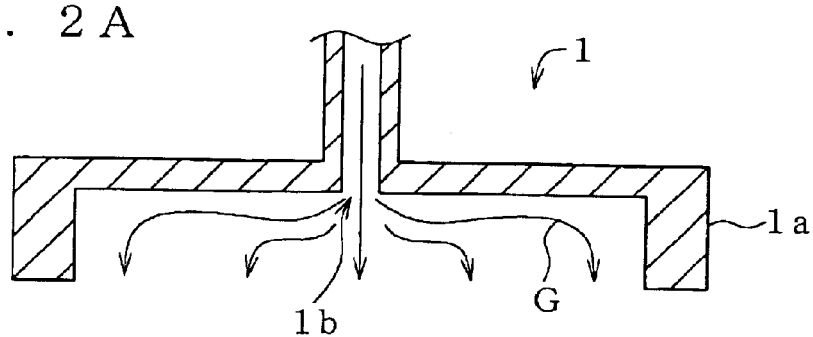
FIG. 2A is a view describing an outline of a Bernoulli chuck used in the invention.

In FIG. 2A, there is shown the Bernoulli chuck 1 used in the wafer recovery step. The body of the Bernoulli chuck 1 is made of, for example, quartz or the like. A gas outflow hole 1b for outflow of a gas G such as nitrogen is formed in the Bernoulli chuck 1. An outer peripheral stopper 1a for guiding an outflow path of the gas G in the axial direction of the Bernoulli chuck 1 and preventing a lateral shift of a wafer chuck held is provided along an outer periphery of the Bernoulli chuck 1.

Figure 2B:
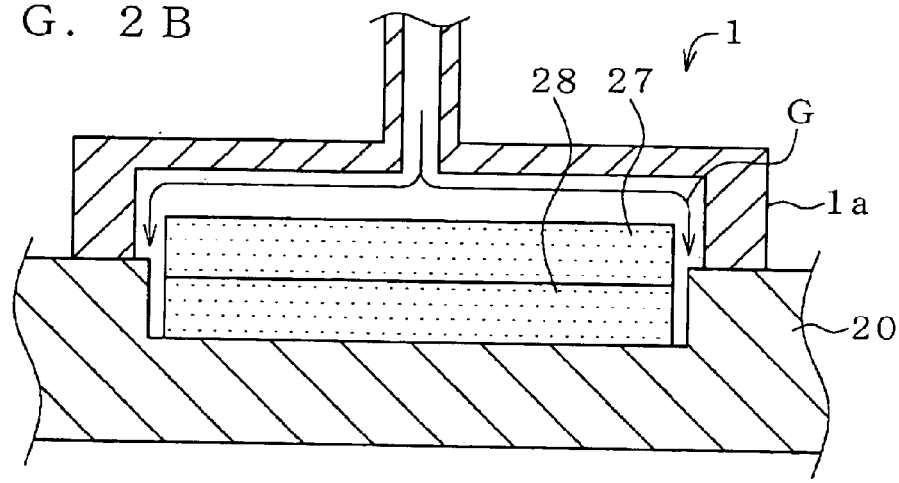
FIGS. 2B and 2C are views describing an action of the Bernoulli chuck of FIG. 2A.
Figure 2C:
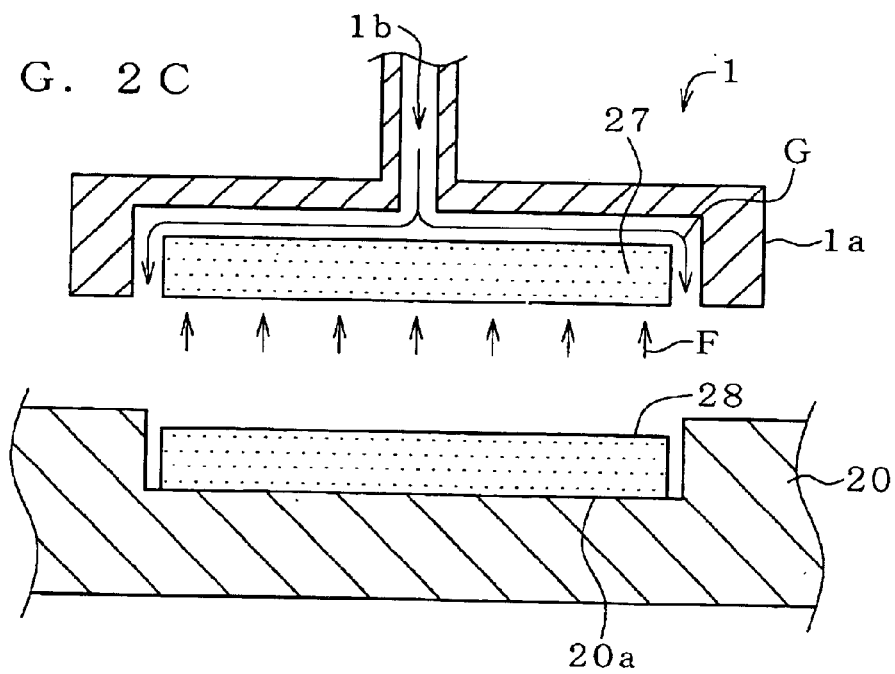

Then, description will be given of an action of the Bernoulli chuck 1. At first, the Bernoulli chuck 1 is, as shown in FIG. 2B, positioned above a bonded wafer 27 and a residual wafer 28 placed on a susceptor 20 as a wafer supporting tool in a state of being superimposed on each other while ejecting the gas G from the gas outflow hole 1b. By doing so, for example in a case where the bonded wafer 27 is positioned on the upper side, the bonded wafer 27 is, as shown in FIG. 2C, attracted to the Bernoulli chuck 1 by a negative pressure F generated by discharge of the gas G. At this time, since the residual wafer 28 positioned on the lower side stays below under an influence of gravity, the bonded wafer 27 and the residual wafer 28 are separated from each other. By moving the Bernoulli chuck 1 to a recovery position together with the bonded wafer 27 suction held, the bonded wafer 27 can be recovered from the susceptor 20 as a wafer supporting tool.

As a susceptor 20 as a wafer supporting tool, preferable is a susceptor on the upper surface 20a of which a bonded wafer 27 and a residual wafer 28 are placed. With such a construction, recovery of the bonded wafer 27 and the residual wafer 28 with the Bernoulli chuck 1 can be easily performed by a horizontal motion of the Bernoulli chuck, which is convenient. Note that a depth of a pocket for each wafer on a susceptor 20 is preferably formed deeper than a thickness of the residual wafer 28 so that the bonded wafer 27 is not shifted after separation. As materials of a susceptor 20, examples thereof preferably used include carbon a surface of which is coated with a silicon carbide film, silicon carbide, quartz and the like.

In a case where a base wafer 22 is, as shown in FIG. 1A, positioned on the upper side in the heat treatment step, a bonded wafer 27 is positioned on the upper side in the recovery step. Description will be given of the wafer recovery step in this case below:

Provided outside of the oven type heat treatment furnace 10 are, as shown in FIG. 1B, a bonded wafer recovery table 50' as a bonded wafer recovery position and a residual wafer recovery table 50" as a residual wafer recovery position. The Bernoulli chuck 1 for sucking and recovering the wafers are attached to a driving mechanism including an arm 56 and an arm driving section 85. At first, in Step 1, the arm 56 is driven to thereby move the Bernoulli chuck 1 to the wafer holding position 60 on the susceptor 20. The Bernoulli chuck 1 is caused to approach the susceptor 20 at the wafer holding position 60. By doing so, the bonded wafer 27 positioned on the upper side is, as shown in FIG. 2C, suction held by a negative pressure with the gas G and in this state, the Bernoulli chuck 1 moves to the bonded wafer recovery table 50' as the bonded wafer recovery position. Then, outflow of the gas G is ceased at the recovery position to cancel chuck holding of the bonded wafer 27 and to recover the bonded wafer 27.

At this stage, since the residual wafer 28 still remains at the wafer holding position 60, in Step 2, the arm 56 is driven by the arm driving section 85 to suction hold the residual wafer 28 at the wafer holding position 60 and in this state, the Bernoulli chuck 1 moves to the residual wafer recovery table 50" to cancel holding there and to recover the residual wafer 28. In this way, when recovery of a wafer at one wafer holding position 60 ends, the next wafer is similarly sucked and recovered at another wafer holding position 60' as well and such operations are repeated to thereby complete recovery of wafers on the susceptor 20 in the entirety.

Note that in the oven type heat treatment furnace 10 of this embodiment in which susceptors 20 are vertically arranged at multiple levels, a construction can also be adopted in which Bernoulli chucks 1 are provided correspondingly to respective susceptor 20 levels. With such a construction adopted, a time required for the wafer recovery step is further reduced, thereby enabling improvement on productivity.

Note that in FIG. 1B, there is shown the construction in which the Bernoulli chuck 1 is inserted into the interior of the oven type heat treatment furnace 10 to take out the bonded wafers 27 and the residual wafers 28, to which the invention is not limited. For example, a procedure can be adopted in which at first, after the heat treatment step ends, the susceptors 20 are taken out with the bonded wafers 27 and the residual wafers 28 remaining placed thereon to the outside of the oven type heat treatment furnace 10, followed by recovery of the bonded wafers 27 and the residual wafers 28 with the Bernoulli chuck 1.

Figure 3A:
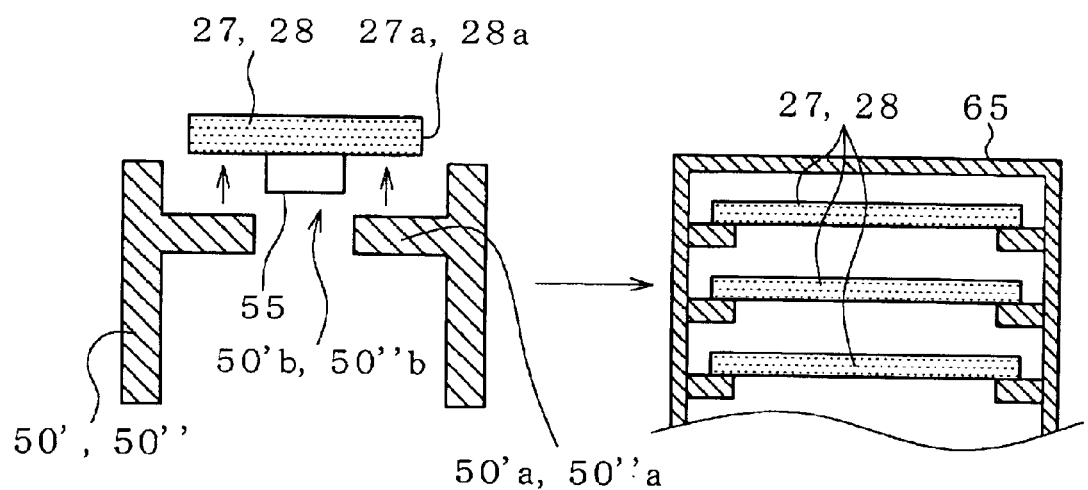
FIG. 3A is a view describing an outline of a step to which a wafer is sent after the wafer recovery step.
Figure 3B:
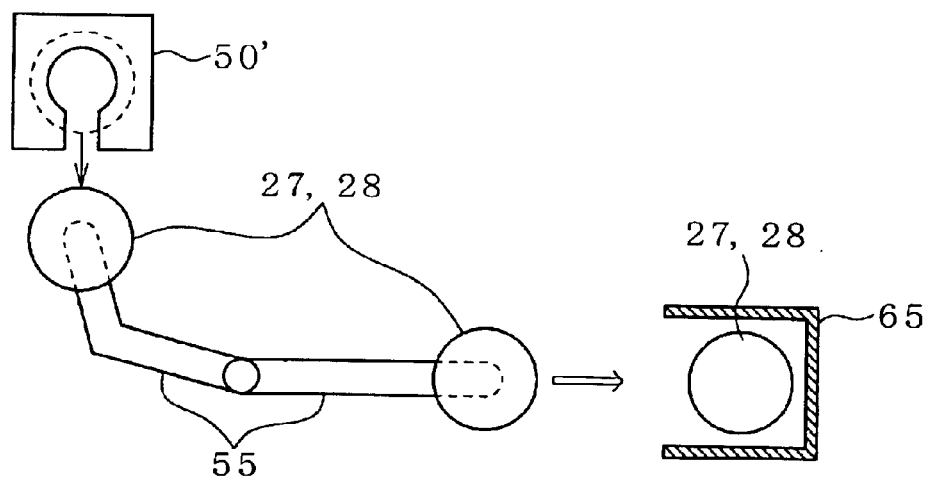
FIG. 3B is a view describing an outline of a step to which a wafer is sent after the wafer recovery step.

Note that in this embodiment, the wafer recovery tables 50' and 50" as the wafer recovery positions each are, as shown in FIG. 3A, of a shape holding wafers 27 and 28 to be recovered only by outer peripheral edges 27a and 28a thereof. Since only the outer peripheral edges 27a and 28a are held, wafer receiving portions 50'a and 50"a are provided in a way such that apertures 50'b and 50"b each with a diameter smaller than a diameter of a wafer to be recovered are formed in inner peripheral portions of the recovery tables 50' and 50." By supporting the wafer 27 or 28 with the wafer receiving portion 50'a or 50"a, the wafer 27 or 28 after recovery can be held at the lower surface thereof by a wafer handling portion of another wafer transfer device. With such a construction, supply of the bonded wafer 27 or 28 to a subsequent step can be easily performed. For example, in a case where wafer 27 or 28 is housed into a wafer cassette 65, the wafer 27 or 28 is, as shown in FIGS. 3A and 3B, raised while being sucked from below using the arm 55 having a wafer handling portion at its distal end and in this state, the arm 55 is, as shown in FIG. 3B, driven to house the wafer 27 or 28 into a wafer cassette 65. Note that in a case where holding from below is not preferable because of surface states of the wafers 27 and 28, it goes without saying that holding from above can be employed instead of holding from below.

After the wafer 27 or 28 are recovered on the wafer recovery tables 50' and 50," and before the next wafers 27 and 28 are moved to the recovery positions used for the respective wafers 27 and 28, the wafers 27 and 28 are, as described above, sequentially moved out from the wafer recovery tables 50' and 50" and subjected to series of subsequent steps. With such a construction adopted, it is only required that driving of the Bernoulli chuck 1 is set limitedly to a reciprocal motion between the wafer holding position 60 and the wafer recovery table 50' or 50," thereby enabling automation in the wafer recovery step with ease.

Figure 4A:
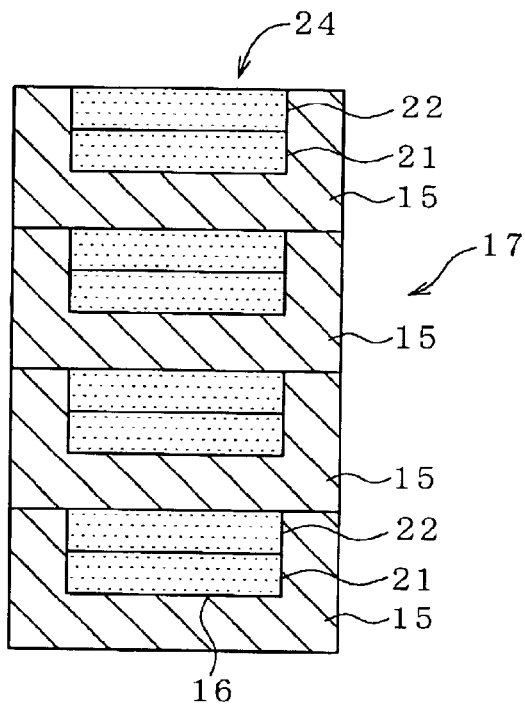
FIG. 4A is a view showing an example installment state of wafers in a heat treatment step.

In a case where bonded dual wafers 24 are arranged in a heat treatment furnace, a method as shown in FIG. 4A may be adopted. That is, a recess 16 for wafer holding is formed on a susceptor 15 as a wafer supporting tool and the bonded dual wafer 24 is disposed in the recess 16. A similar susceptor 15 is placed thereon and a bonded dual wafer 24 is disposed in a similar way to that described above. Then, a structure composed of the susceptor 15 and the bonded dual wafer 24 disposed in the recess thereon is repeatedly stacked one on the other several times to form a layered structure (in FIG. 4A, a 4 layer structure). The stacked structure 17 is, in this state, placed in the interior of the oven type heat treatment furnace 10, followed by a heat treatment. By placing the stacked structure 17 in the oven type heat treatment furnace 10, a through-put of products can be greatly increased.

Figure 4B:
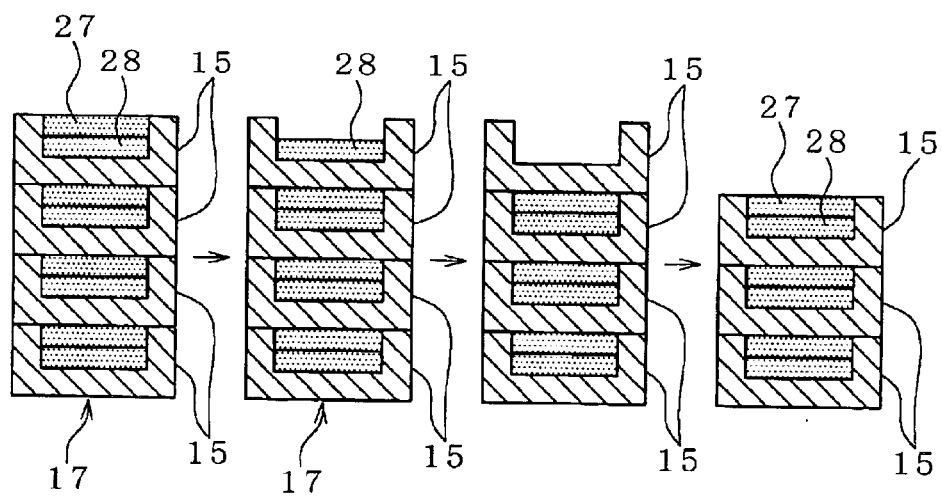
FIG. 4B is a view showing an example of the wafer recovery step conducted in the installment state of FIG. 4A.

In a case where after the heat treatment in the above construction described above, the bonded wafers 27 are recovered from the stacked structure 17, the recovery can be performed with the method shown in FIG. 4B. That is, at first, the bonded wafer 27 after the separation step placed in the uppermost layer of the stacked structure 17 is taken out with the Bernoulli chuck 1 and the residual wafer 28 disposed in the same susceptor 15 is similarly taken out with the Bernoulli chuck 1. Then, the susceptor 15 from which the bonded wafer 27 and the reused wafer 28 have been taken out is taken out. The above series of steps is repeated to take out the bonded wafers 27 and the residual wafers 28 and the susceptors 15 of the stacked structure 17. At this time, a mechanism to take out the susceptors 15 does not necessarily require the Bernoulli chuck. Since a weight of a susceptor 15 is predicted to be larger than a total weight of a bonded wafer 27 and a residual wafer 28 combined, it is desirable to adopt rather a different taking-out mechanism, which makes it certain to take out the susceptor, than the Bernoulli chuck.

Figure 6:
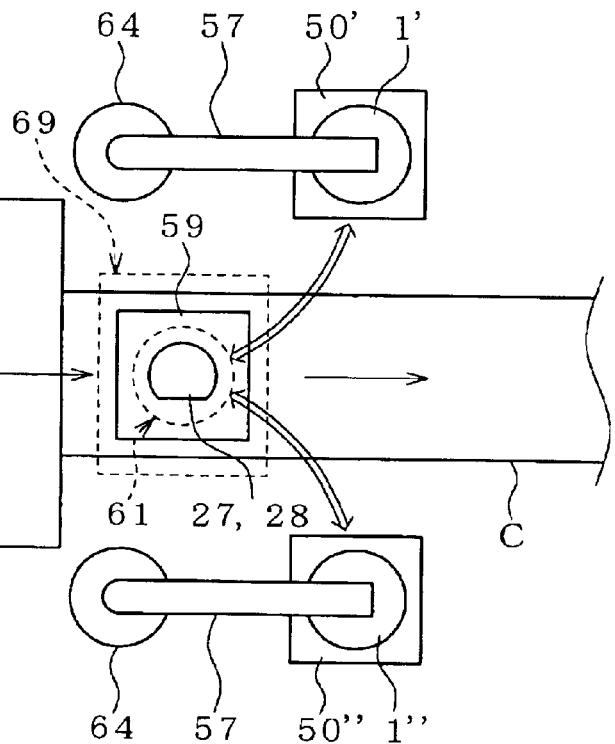
FIG. 6 is a view showing an example method conducting the wafer recovery step in a transport route.

The wafer recovery step can be conducted in the transport route. A method shown in FIG. 6 can be exemplified. In FIG. 6, there is shown a construction including a bonded wafer recovery table 50' as a bonded wafer recovery position, a residual wafer recovery table 50" as a residual wafer recovery position, which are arranged on the respective both sides of the transport route C. Furthermore, Bernoulli chucks 1' and 1" for holding a bonded wafer 27 and a residual wafer 28 are disposed on the same sides as the respective corresponding wafer recovery tables 50' and 50." The Bernoulli chucks 1' and 1" each are driven by a driving mechanism including an arm 57 and an arm driving mechanism 64, and can move between a wafer holding position 61 on the transport route C and each of the wafer recovery tables 50' and 50."

Figure 9A:
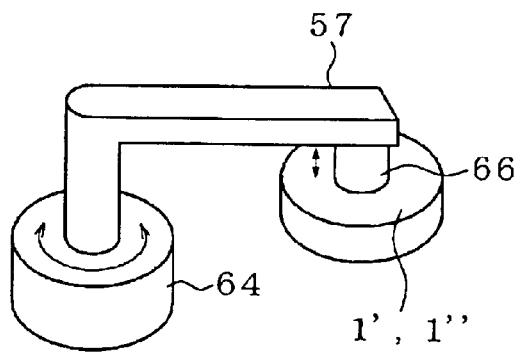
FIG. 9A is a view showing an example Bernoulli chuck driving mechanism used in the invention.

In FIG. 9A, there is shown an outline of the driving mechanism driving the Bernoulli chucks 1' and 1." The Bernoulli chuck 1' or 1" is driven in a direction, from above to below or from below to above; for example, a Bernoulli chuck is attached to the arm 57 with the chuck driving mechanism 66 such as an air cylinder interposed therebetween and the arm 57 is rotatably attached to the arm driving mechanism 64 such as an electric motor.

In the method of FIG. 6, when a tray 59 on which wafers 27 and 28 are placed arrives in a wafer holding region 69 on the transport route C, the Bernoulli chuck 1' is at first moved to the wafer holding position 61 to hold the bonded wafer 27 positioned on the upper side. The Bernoulli chuck 1' in this state is moved to above the wafer recovery table 50', where holding of the bonded wafer 27 is cancelled and the bonded wafer 27 is recovered. Subsequent to this operation, the Bernoulli chuck 1" is moved to the wafer holding position 61. The Bernoulli chuck 1" holds the residual wafer 28 remaining at the wafer holding position 61 and moves to the residual wafer recovery position 50" to recover the residual wafer 28 there.

Figure 7:
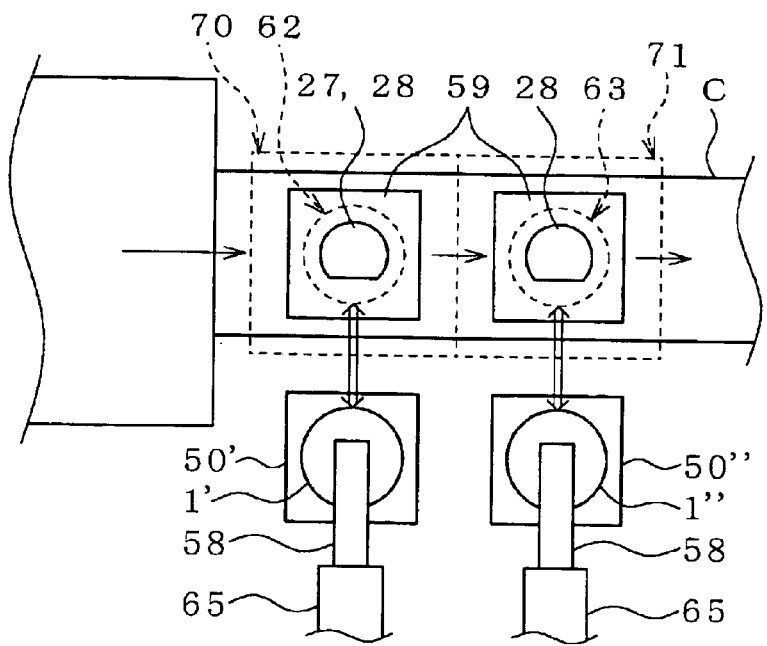
FIG. 7 is a view showing an example method conducting the wafer recovery step in the transport route, different from the method of FIG. 6.

As a method conducting the wafer recovery step on the transport route C, a method as shown in FIG. 7 can also be adopted. In FIG. 7, there are shown a configuration in which the bonded wafer recovery table 50' and the residual wafer recovery table 50" are installed on one side of the transport route C. Furthermore, the configuration includes a bonded wafer holding position 62 for holding a bonded wafer 27 and a residual wafer holding position 63 for holding the residual wafer 28 installed at positions different from each other on the transport route C. The Bernoulli chucks 1' and 1" for holding a bonded wafer 27 and a residual wafer 28 are disposed on the same side as the respective corresponding wafer recovery tables 50' and 50". The Bernoulli chucks 1' and 1" each are driven by a driving mechanism including an arm 58 and an arm driving mechanism 65 and movable between wafer holding positions 62 and 63, and respective corresponding wafer recovery tables 50' and 50". In this method, the bonded wafer 27 is moved from the bonded wafer holding position 62 to the bonded wafer recovery position 50' and recovered there while the residual wafer 28 is moved from the residual wafer holding position 63 to the residual wafer recovery position 50" and recovered there.

Figure 9B:
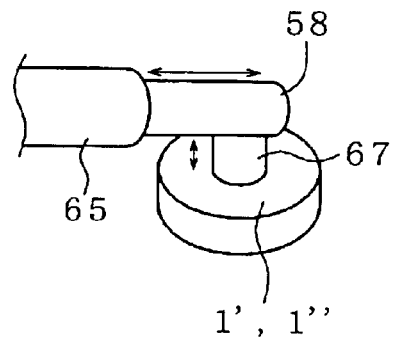
FIG. 9B is a view showing an example Bernoulli chuck driving mechanism used in the invention, different from FIG. 9A.

In FIG. 9B, there is shown an outline of the driving mechanism driving the Bernoulli chucks 1' and 1" of FIG. 7. The Bernoulli chucks 1' and 1" are driven in a direction, from above to below or from below to above; for example, the Bernoulli chucks 1' and 1" each are attached to an arm 58 with a chuck driving mechanism 67 such as an air cylinder interposed therebetween and the arm 58 is attached to an arm driving mechanism 65 such as an air cylinder, so that the arm 58 can be directly driven thereby.

As a concrete method, when a tray 59 arrives in the bonded wafer holding region 70 on the transport route C, the Bernoulli chuck 1' is firstly moved to the bonded wafer holding position 62 and then holds the bonded wafer 27 positioned on the upper side. The Bernoulli chuck 1' in this state is moved to above the wafer recovery table 50' to recover the bonded wafer 27 there. After the bonded wafer 27 is moved from the bonded wafer holding position 62, the transport route C is driven to transport the tray 59 to the residual wafer holding region 71 and subsequently, the Bernoulli chuck 1" is moved to the wafer holding position 63. Then, the Bernoulli chuck 1" holds the residual wafer 28 positioned at the wafer holding position 63 and in this state, moves to the residual wafer recovery table 50" to recover the residual wafer 28 there.

Figure 8A:
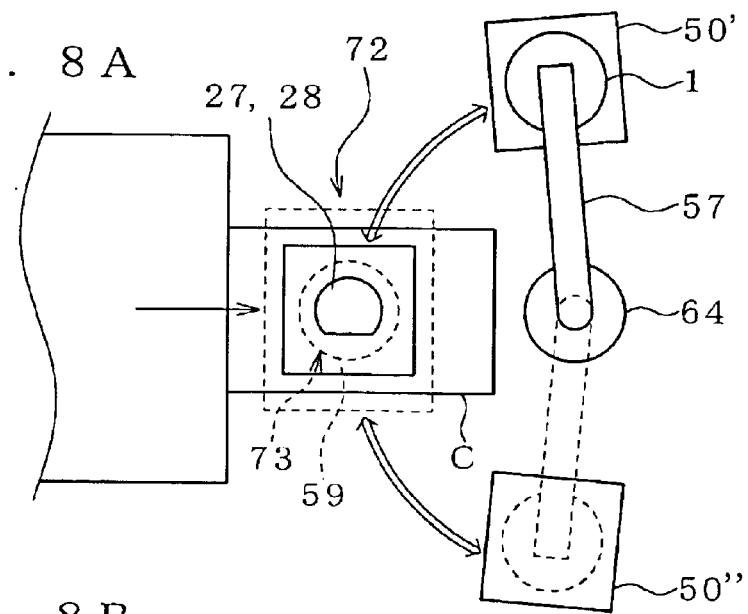
FIG. 8A is a view showing an example method conducting the wafer recovery step in the transport route, different from the methods of FIGS. 6 and 7.
Figure 8B:
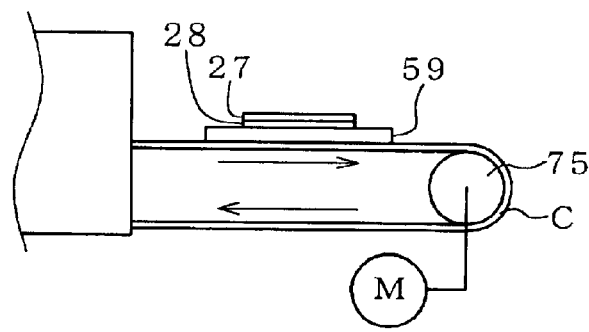
FIG. 8B is a view showing an outline of the transport route of FIG. 8A.

It is possible that, as described in FIG. 8A, a bonded wafer 27 and a residual wafer 28 can be recovered with one Bernoulli chuck 1. In the method, a transport route C is constructed as shown in FIG. 8B. The transport route C is, for example, wound around a gear such as a timing pulley 75 and travels by driving with a driving motor M.

In the method, when a tray 59 is positioned in a wafer holding region 72 on the transport route C, a Bernoulli chuck 1 is moved to a wafer holding position 73 to hold a bonded wafer 27 positioned on the upper side. The Bernoulli chuck 1 in this state moves to above a bonded wafer recovery table 50' to recover the bonded wafer 27 there. Subsequently, the Bernoulli chuck 1 again moves to the wafer holding position 73 and holds a residual wafer 28 remaining at the wafer holding position 73 and moves to a residual wafer recovery position 50" to recover the residual wafer 28 there.

Note that while in FIGS. 6, 7, 8A and 8B, description is given of a case where a bonded wafer 27 is positioned on the upper side, even in a case where the bonded wafer 27 and a residual wafer 27 are inversely superimposed on each other, recovery is enabled in a similar process by inverting recovery of the bonded wafer 27 and the residual wafer 28 in sequence.

Figure 5A:
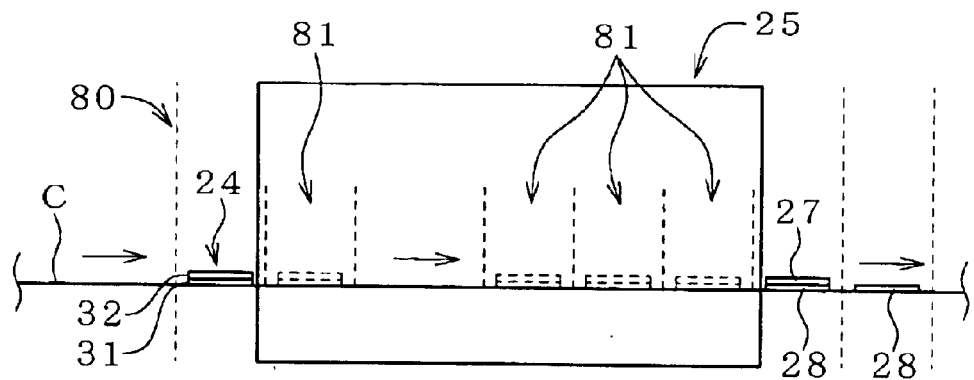
FIG. 5A is a view showing an example continuous heat treatment furnace in which the heat treatment step is conducted.
Figure 5B:
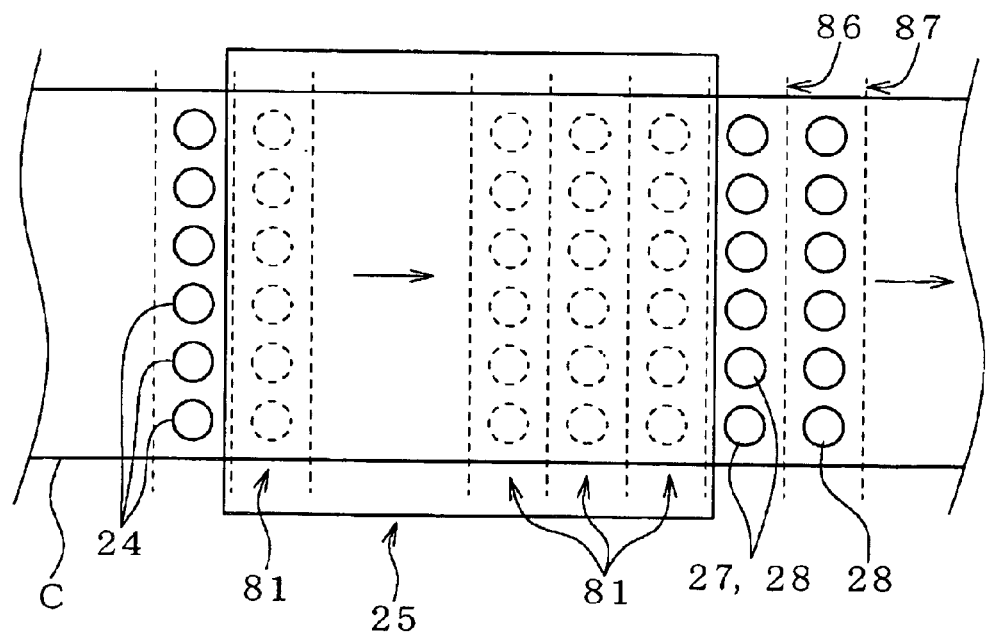
FIG. 5B is a view showing an installment state of wafers in the continuous heat treatment furnace of FIG. 5A.

In a method for manufacturing a bonded wafer of the invention, a heat treatment may be conducted in a transport route. In that case, a continuous heat treatment furnace 25 (hereinafter also referred to simply as a heat treatment furnace 25) is disposed in the transfer route C as shown in FIGS. 5A and 5B. A bonded dual wafer 24 is placed on a loader section 80 in the transport route C. Then, the transport route C is driven to carry the bonded dual wafer 24 into the heat treatment furnace 25. The interior of the heat treatment furnace 25 is heated to and held at a desired temperature and the bonded dual wafer 24 passes through the heat treatment furnace 25 to thereby apply a heat treatment on the bonded dual wafer 24. After the bonded dual wafer 25 passes through the heat treatment furnace 25, separation in a bond wafer 21 is effected in the heat treatment to form a bonded wafer 27 and a residual wafer 28.

In a case where heating zones 81 are formed in the heat treatment furnace 25 and a heat treatment temperature is individually set in each of the heating zones 81, the bonded dual wafer 24 can pass through the heat treatment furnace 25 with a dynamic change in the heat treatment conditions. For example, in a case where heat treatment conditions of 500° C. and 30 min are adopted, 6 heating zones 81 are necessary in the heat treatment furnace 25 with each heating zone having a residence time of the wafer 24 of 5 min. In this case, a heat treatment temperature is set at 500° C. in each of the 6 heating zones 81. In a case where a rise in temperature up to 500° C. is stepwise required, a set temperature of a heating zone 81 has only to be properly varied. Note that a way of transporting the bonded dual wafer 24 in the heat treatment step may be either continuous or intermittent over the heating zones 81.

In the wafer recovery step, a procedure is allowed in which a bonded wafer 27 and a residual wafer 28 formed in a heat treatment are transported to a first unloader section 86 on the transport route C, the bonded wafer 27 positioned on the upper side is recovered, thereafter the residual wafer 28 remaining left behind on the lower side is transported to a second unloader section 87 to recover the residual wafer 28 there. Note that after the bonded wafer 27 is recovered, the residual wafer 28 may be recovered in the first unloader section 86.

The bonded dual wafers 24 may be, as shown in FIG. 5B, arranged so as to form a row perpendicular to a transport direction. With such an arrangement adopted, since multiple bonded dual wafers 24 can be heat treated in a short time, a throughput of products can be increased. In this embodiment, 6 bonded dual wafers 24 are lined in one row.

Figure 10A:
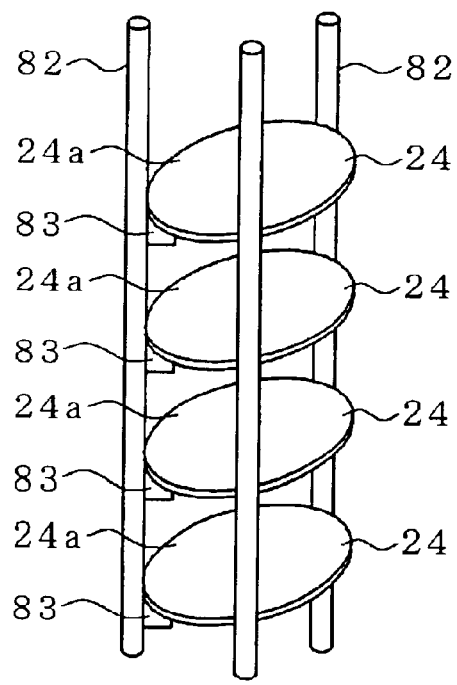
FIG. 10A is a view showing an example installment state of wafers in the heat treatment step.

An arrangement of bonded dual wafers 24 in a heat treatment can be an arrangement thereof as shown in FIG. 10A. According to this arrangement, 3 pole-shaped members 82 as a wafer supporting tool on which wafer supporting portions 83 are formed, are prepared and the pole-shaped members 82 are disposed so that the wafer supporting portions 83 formed on the pole-shaped members 82 face one another. The bonded dual wafers 24 are held by the pole-shaped members 82 in a way such that the outer peripheral edge portion 24a of a bonded dual wafer 24 is rest on a wafer supporting portion 83. In this embodiment, wafer supporting portions 83 are formed on one pole-shaped member 82 at the equal spacings and several bonded dual wafers 24 are arranged at corresponding levels. Note that if bonded dual wafers 24 are arranged in a horizontal plane, a possibility arises that wafers positioned on the upper side slide down after a separation heat treatment; therefore, the bonded dual wafers 24 are required to be supported with inclination at an angle of the order of several degrees.

Figure 10B:
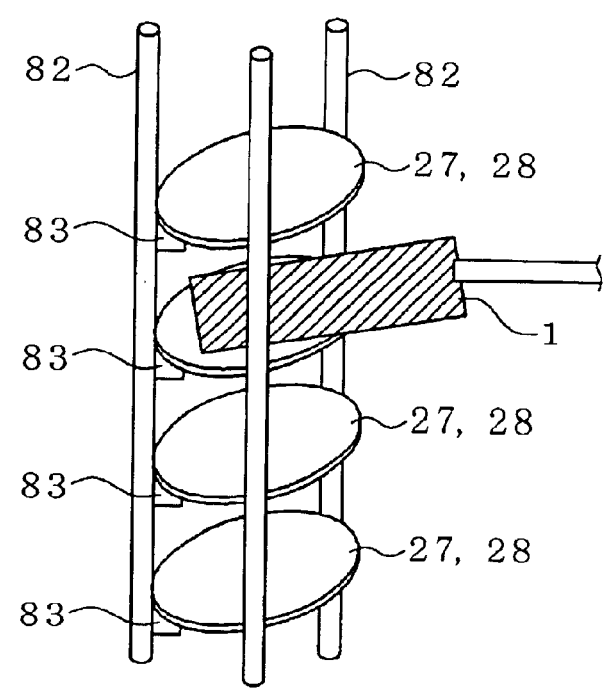
FIG. 10B is a view showing an example wafer recovery step conducted in the installment state of FIG. 10A.

A heat treatment is applied to the bonded dual wafers 24 supported in this way to form bonded wafers 27 and residual wafers 28, thereafter, as shown in FIG. 10B, a Bernoulli chuck 1 is inserted between wafer supporting levels and approaches a bonded wafer 27 or a residual wafer 28 to recover the wafers.

EXAMPLE 1

Figure 11:
FIG. 11 is views showing an example bonded wafer manufacturing process.
Figure 11:
Figure 11:
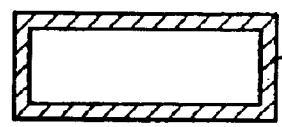
Figure 11:
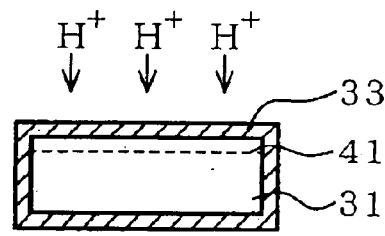
Figure 11:
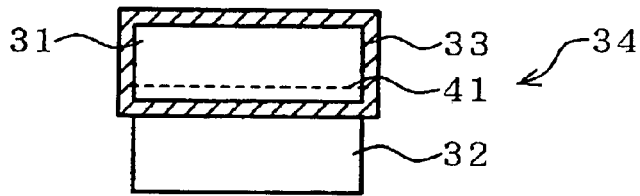
Figure 11:
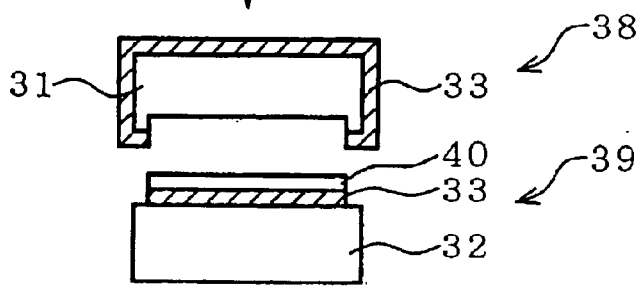
Figure 12A:
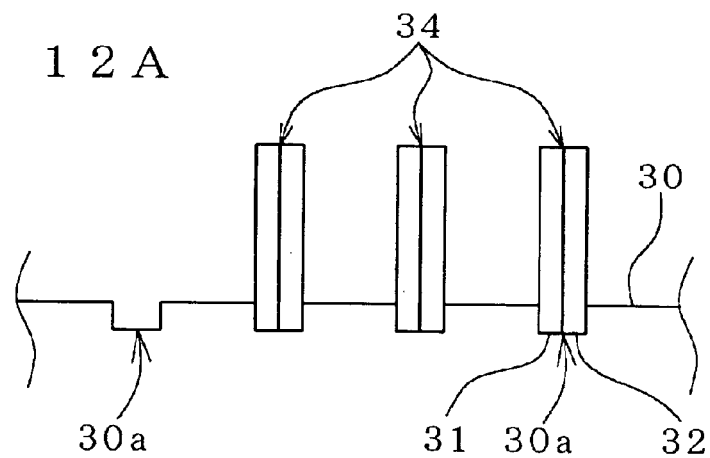
FIGS. 12A to 12C are schematic views describing a conventional bonded wafer manufacturing process.
Figure 12B:
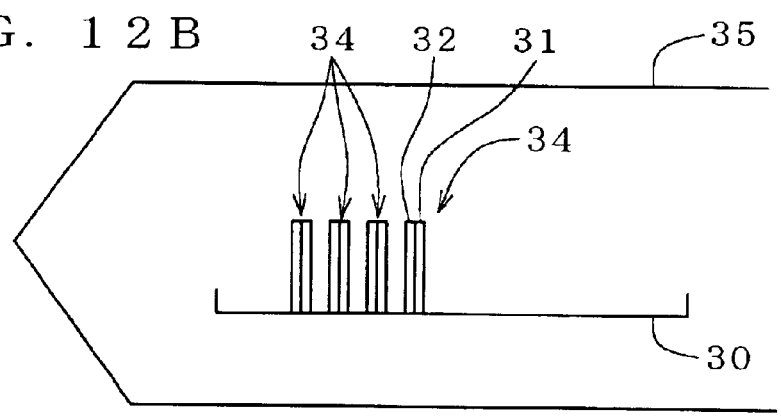
Figure 12C:
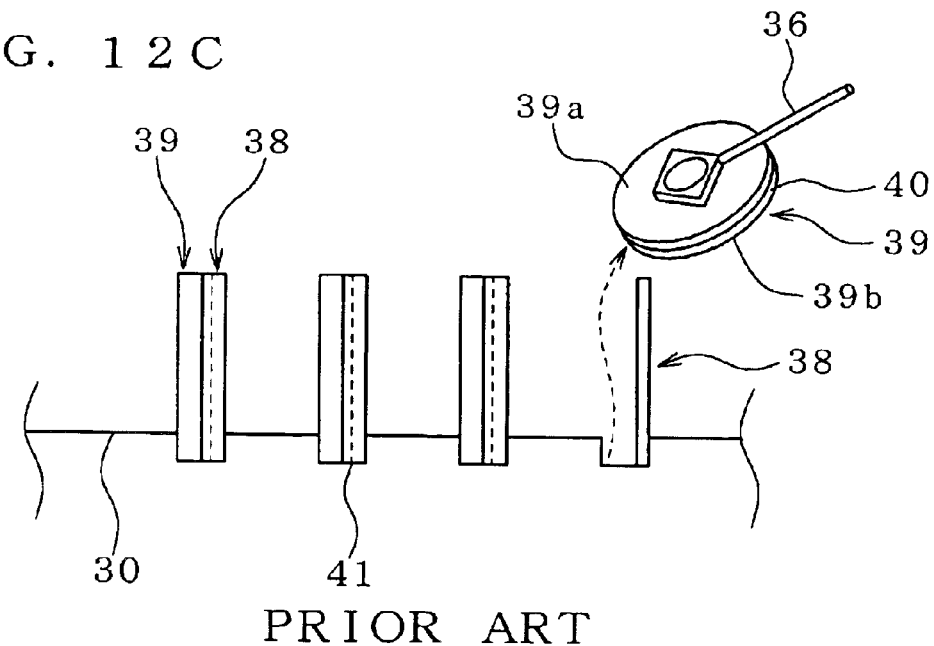

Two wafers of 10 Ω·cm in resistivity and 200 mm in diameter were prepared wherein one wafer was used as a bond wafer 31 and the other was used as a base wafer 32 and a bonded SOI wafer 27 was prepared according to the method of FIG. 11. A film thickness of an oxide film was 400 nm, and the bond wafer 31 on which hydrogen ion implantation was performed in conditions that an acceleration voltage is 85 eKV and a dose is $5.5 \times 10^{16}$ cm$^{-2}$ and the base wafer 32 were bonded to each other. The bonded dual wafer was, as shown in FIG. 1A, heat treated at 500° C. for 30 min in an argon gas and nitrogen gas atmosphere in the heat treatment furnace 10. After a bonded wafer 27 is formed, a Bernoulli chuck 1 was, as described in FIG. 1B, used to recover the bonded wafer 27 and a residual wafer 28 after separation.

As a result, the recovered bonded wafer 27 and the recovered residual wafer 28 were observed to be free from a defect and deficiency generated by rubbing exposed separation surfaces against each other, and scratches, contamination and the like on a wafer edge surface and a wafer rear surface. It was confirmed that a throughput of products was increased.

EXAMPLE 2

A bond wafer 21 and a base wafer 22 was bonded to each other in conditions similar to those of Example 1, and a bonded dual wafer was heat treated in the continuous heat treatment furnace 25 shown in FIGS. 5A and 5B. Heat treatment conditions were at 500° C. for 30 min, similar to Example 1 and other conditions were set such that the number of the heating zones was 6 and a residence time in each heating zone was 5 min. After a bonded wafer 27 was formed by the heat treatment, the bonded wafer 27 and the residual wafer 28 were recovered according to the method shown in FIG. 7.

As a result, the recovered bonded wafer 27 and the recovered residual wafer 28 were observed to be free from a defect and deficiency generated by rubbing exposed separation surfaces against each other, and scratches, contamination and the like on a wafer edge surface and a wafer rear surface. It was confirmed that a throughput of products was increased.

What is claimed is:

1. A method for manufacturing a bonded wafer comprising: a bonded wafer preparation step of ion implanting at least one kind selected from the group consisting of a hydrogen ion, a rare gas ion and a halogen ion onto a main surface of a first wafer to form an ion implanted layer in the interior of the first wafer and bonding the main surface of the first wafer onto which ion implantation is effected to a main surface of a second wafer to heat treat the first wafer and the second wafer after bonding (hereinafter also referred to as a bonded dual wafer), to thereby separate the first wafer at the ion implanted layer in the form of a thin film; and a wafer recovery step of recovering at least one of a bonded wafer and a residual wafer, which is a residue of the first wafer, supported by a wafer supporting tool in a state of being superimposed on each other after the bonded wafer preparation step by suction holding the at least one using a Bernoulli chuck and wherein in the wafer recovery step, the Bernoulli chuck moves between a wafer holding position at which the bonded wafer and/or the residual wafer on the wafer supporting tool is held and a wafer recovery position at which the bonded wafer and/or the residual wafer held is recovered and the Bernoulli chuck suction holds the bonded wafer and/or the residual wafer at the wafer holding position, and moves to the wafer recovery position keeping this holding state, and then cancels the holding to thereby recover the bonded wafer and/or the residual wafer.

2. A method for manufacturing a bonded wafer according to claim 1, wherein a bonded wafer recovery position for recovering the bonded wafer and a residual wafer recovery position for recovering the residual wafer are installed at respective positions different from each other.

3. A method for manufacturing a bonded wafer according to claim 4, wherein the wafer recovery step is conducted in a transport route along which the bonded wafer and the residual wafer are transported continuously or intermittently and in the wafer recovery step, the bonded wafer and the residual wafer are moved from the wafer holding position on the transport route to the wafer recovery position located spaced apart from the transport route in a horizontal direction.

4. A method for manufacturing a bonded wafer according to claim 3, wherein in the wafer recovery step, the bonded wafer recovery position and the residual wafer recovery position are arranged on the respective both sides of the transport route.

5. A method for manufacturing a bonded wafer according to claim 3, wherein in the wafer recovery step, a bonded wafer holding position for holding the bonded wafer and a residual wafer holding position for holding the residual wafer are installed at respective positions different from each other on the transport route and the bonded wafer is moved from the bonded wafer holding position to the bonded wafer recovery position and the residual wafer is moved from the residual wafer holding position to the residual wafer recovery position.

6. A method for manufacturing a bonded wafer according to claim 4, wherein in the wafer recovery step, a bonded wafer holding position for holding the bonded wafer and a residual wafer holding position for holding the residual wafer are installed at respective positions different from each other on the transport route and the bonded wafer is moved from the bonded wafer holding position to the bonded wafer recovery position and the residual wafer is moved from the residual wafer holding position to the residual wafer recovery position.

7. A method for manufacturing a bonded wafer comprising: a bonded wafer preparation step of ion implanting at least one kind selected from the group consisting of a hydrogen ion, a rare gas ion and a halogen ion onto a main surface of a first wafer to form an ion implanted layer in the interior of the first wafer and bonding the main surface of the first wafer onto which ion implantation is effected to a main surface of a second wafer to heat treat the first wafer and the second wafer after bonding (hereinafter also referred to as a bonded dual wafer), to thereby separate the first wafer at the ion implanted layer in the form of a thin film; and a wafer recovery step of recovering at least one of a bonded wafer and a residual wafer, which is a residue of the first wafer, supported by a wafer supporting tool in a state of being superimposed on each other after the bonded wafer preparation step by suction holding the at least one using a Bernoulli chuck, and wherein in the wafer recovery step, the bonded wafer and the residual wafer are supported by the wafer supporting tool in a state being superimposed on each other in a direction, from above to below or from below to above, the bonded wafer and the residual wafer superimposed on each other are sequentially recovered by suction from one positioned on the upper side with the Bernoulli chuck, the Bernoulli chuck moves between a wafer holding position at which the bonded wafer and/or the residual wafer on the wafer supporting tool is held and a wafer recovery position at which the bonded wafer and/or the residual wafer held is recovered and the Bernoulli chuck suction holds the bonded wafer and/or the residual wafer at the wafer holding position, and moves to the wafer recovery position keeping this holding state, and then cancels the holding to thereby recover the bonded wafer and/or the residual wafer.

8. A method for manufacturing a bonded wafer according to claim 7, wherein a bonded wafer recovery position for recovering the bonded wafer and a residual wafer recovery position for recovering the residual wafer are installed at respective positions different from each other.

9. A method for manufacturing a bonded wafer according to claim 8, wherein the wafer recovery step is conducted in a transport route along which the bonded wafer and the residual wafer are transported continuously or intermittently and in the wafer recovery step, the bonded wafer and the residual wafer are moved from the wafer holding position on the transport route to the wafer recovery position located spaced apart from the transport route in a horizontal direction.

10. A method for manufacturing a bonded wafer according to claim 9, wherein in the wafer recovery step, the bonded wafer recovery position and the residual wafer recovery position are arranged on the respective both sides of the transport route.

11. A method for manufacturing a bonded wafer according to claim 9, wherein in the wafer recovery step, a bonded wafer holding position for holding the bonded wafer and a residual wafer holding position for holding the residual wafer are installed at respective positions different from each other on the transport route and the bonded wafer is moved from the bonded wafer holding position to the bonded wafer recovery position and the residual wafer is moved from the residual wafer holding position to the residual wafer recovery position.

12. A method for manufacturing a bonded wafer according to claim 10, wherein in the wafer recovery step, a bonded wafer holding position for holding the bonded wafer and a residual wafer holding position for holding the residual wafer are installed at respective positions different from each other on the transport route and the bonded wafer is moved from the bonded wafer holding position to the bonded wafer recovery position and the residual wafer is moved from the residual wafer holding position to the residual wafer recovery position.

* * * * *

UNITED STATES PATENT AND TRADEMARK OFFICE
CERTIFICATE OF CORRECTION

PATENT NO. : 6,897,124 B2
DATED : May 24, 2005
INVENTOR(S) : Naoto Tate and Hiroji Aga It is certified that error appears in the above-identified patent and that said Letters Patent is hereby corrected as shown below:

Column 12,
Line 36, delete "4" and substitute therefore -- 2 --.

Signed and Sealed this

Sixteenth Day of August, 2005

JON W. DUDAS
*Director of the United States Patent and Trademark Office*